(12) United States Patent
Ko et al.

(10) Patent No.: US 8,477,873 B2
(45) Date of Patent: Jul. 2, 2013

(54) APPARATUS FOR GENERATING FREQUENCY SIGNAL

(75) Inventors: SangSoo Ko, Suwon-si (KR); Sunggi Yang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 378 days.

(21) Appl. No.: 12/974,498

(22) Filed: Dec. 21, 2010

(65) Prior Publication Data

US 2011/0188601 A1 Aug. 4, 2011

(30) Foreign Application Priority Data

Feb. 3, 2010 (KR) .................. 10-2010-0010066

(51) Int. Cl.
*H04L 27/12* (2006.01)
*H03C 3/00* (2006.01)
*H03K 7/06* (2006.01)

(52) U.S. Cl.
USPC ........... 375/307; 375/260; 375/295; 375/373; 375/376; 327/156; 455/260

(58) Field of Classification Search
USPC .......... 375/260, 295, 307, 373, 376; 327/156; 455/260
See application file for complete search history.

(56) References Cited

U.S. PATENT DOCUMENTS

| 7,321,268 B2 | 1/2008 | Chang et al. |
| 7,589,597 B2 * | 9/2009 | Chang et al. .................. 331/37 |
| 7,949,072 B2 * | 5/2011 | Krivokapic et al. .......... 375/306 |
| 2007/0178869 A1 | 8/2007 | Park et al. |
| 2007/0189361 A1 | 8/2007 | Sugiyama et al. |
| 2007/0298750 A1 | 12/2007 | Masuda |
| 2008/0130713 A1 | 6/2008 | Shim et al. |
| 2008/0285625 A1 | 11/2008 | Chang et al. |

FOREIGN PATENT DOCUMENTS

| JP | 2006-067520 A | 3/2006 |
| JP | 2007-522726 T | 8/2007 |
| JP | 2007-295066 A | 11/2007 |
| JP | 2007-329804 A | 12/2007 |
| JP | 2008-283659 A | 11/2008 |
| KR | 10 2006-0123583 A | 12/2006 |
| KR | 10 2007-0077664 A | 7/2007 |
| KR | 10 2007-0104292 A | 10/2007 |
| KR | 10 2007-0118013 A | 12/2007 |
| KR | 10 2008-0004162 A | 1/2008 |
| KR | 10-0802191 B1 | 1/2008 |
| KR | 10-0877569 B1 | 12/2008 |
| WO | WO 2005-074152 A1 | 8/2005 |

* cited by examiner

*Primary Examiner* — Ted Wang
(74) *Attorney, Agent, or Firm* — Lee & Morse, P.C.

(57) ABSTRACT

A frequency signal generator includes a controller for generating a frequency generation signal, a reference frequency signal generator for generating a first frequency signal and generate a second frequency signal by dividing a first frequency signal from the controller, an assistance frequency signal generator adapted to generate a third, fourth, and fifth frequency signals and to output a sixth frequency signal in response to an assistance frequency select signal, a mixer for selecting a sign of the sixth frequency signal in response to a sign select signal and generating a seventh frequency signal and a eighth frequency signal by mixing the sixth frequency signal of the selected sign and the first frequency signal, a switch adapted to output the seventh or eighth frequency signal in response to a dividing select signal, and a first divider outputting a ninth frequency signal by dividing the eighth frequency signal from the switch.

20 Claims, 9 Drawing Sheets

APPARATUS FOR GENERATING FREQUENCY SIGNAL

BACKGROUND

1. Field

Embodiments relate to a wideband communication system, and more particularly, to a frequency signal generation apparatus generating frequency signals of various band groups.

2. Description of the Related Art

Generally, a wideband communication system is a system that transmits wanted data using a plurality of frequency bands having a specific bandwidth. More particularly, a wideband communication system transmits wanted data using a plurality of sub-band frequency bands having specific bandwidths, which together enable a relatively large amount of data to be transmitted per hour.

Multi-Band Orthogonal Frequency Division Multiplexing (hereinafter it is referred to as 'MB-OFDM') is one method for embodying the wideband communication system. The MB-OFDM method has an advantage in that it can be flexibly used in response to frequency allocation, which is different for different countries. Thus, a wideband wireless communication system of MB-OFDM method is being actively developed.

SUMMARY

Embodiments are therefore directed to a wideband communication system, which substantially overcome one or more of the problems due to the limitations and disadvantages of the related art.

It is therefore a feature of an embodiment to provide a frequency signal generation apparatus adapted to generate frequency signals of various band groups.

It is therefore a separate feature of an embodiment to provide a frequency signal generating apparatus adapted to support multi-band multi-mode communication by merging apparatuses having different bands from each other into one apparatus.

It is therefore a separate feature of an embodiment to provide a single frequency signal generation apparatus adapted to generate all the frequency signals corresponding to 1, 3, 4, and 6 Multi-Band Orthogonal Frequency Division Multiplexing (MB-OFDM) band groups.

At least one of the above and other features and advantages may be realized by providing a frequency signal generation unit, including a control circuit adapted to generate a frequency generation signal, an assistance frequency select signal, a sign select signal, and a dividing select signal, a reference frequency signal generator adapted to generate a first frequency signal and generate a second frequency signal by dividing the generated first frequency signal, an assistance frequency signal generator adapted to generate a third frequency signal, generate fourth and fifth frequency signals by dividing the third frequency signal by a different division ratio, and generate a sixth frequency signal from the fourth and fifth frequency signals in response to the assistance frequency select signal, a mixer adapted to select a sign of the sixth frequency signal in response to the sign select signal and generate a seventh frequency signal and a eighth frequency signal by mixing the sixth frequency signal of the selected sign and the first frequency signal, a switch adapted to output the seventh frequency signal or the eight frequency signal in response to the dividing select signal, and a first divider adapted to output a ninth frequency signal by dividing the eighth frequency signal received from the switch, the first divider being coupled to the switch.

The reference frequency signal generator may include a first phase locked loop adapted to generate the first frequency signal in response to the frequency generation signal, and a second divider adapted to generate a second frequency signal by dividing the first frequency signal by two, the second divider being coupled to the first phase locked loop.

The assistance frequency signal generator may include a second phase locked loop adapted to generate the third frequency signal, a second divider adapted to generate the fourth frequency signal by dividing the third frequency signal by four, a harmonic rejection unit adapted to generate a tenth frequency signal by rejecting harmonics of the fourth frequency signal, a third divider adapted to generate the fifth frequency signal by dividing the third frequency signal by two, a selector adapted to output the sixth frequency signal by selecting one of the tenth frequency signal and the fifth frequency signal, the selector being coupled to the harmonic rejection unit and the third divider, and a mixer adapted to output one of the seventh frequency signal and the eighth frequency signals by mixing the second frequency signal and the sixth frequency signal.

In response to the frequency generation signal, the first phase locked loop may be adapted to generate the first frequency signal of 15312 MHz when generating a frequency signal of a third band group, to generate the first frequency signal of 15840 MHz when generating a frequency signal of a first band group, and to generate the first frequency signal of 16368 MHz when generating frequency signals of fourth and sixth band groups, wherein the second divider may be adapted to generate a second frequency signal of one of 7656 MHz, 7920 MHz, and 8184 MHz by dividing the respective one of the first frequency signals by two.

The second phase locked loop may be adapted to generate the third frequency signal of 2112 MHz, wherein the third divider may be adapted to generate the fourth frequency signal of 528 MHz by dividing the third frequency signal by four, wherein the fourth divider generates the fifth frequency signal of 1056 MHz by dividing the third frequency signal by two, wherein the selector may be adapted to select the sixth frequency signal of one of 0 MHz, 528 MHz, and 1056 MHz using the fourth frequency signal and the tenth frequency signal.

The mixer may generate the seventh frequency signal corresponding to the third band group by mixing the second frequency signal of 7656 MHz and one of the sixth frequency signal of 1056 MHz with (−)sign, the sixth frequency signal of 528 MHz with (−)sign, and the sixth frequency signal of 0 MHz, the seventh frequency signal corresponding to the fourth band group by mixing the second frequency signal of 8184 MHz and one of the sixth frequency signal of 1056 MHz with (+)sign, the sixth frequency signal of 528 MHz with (+)sign, and the sixth frequency signal of 0 MHz, the seventh frequency signal corresponding to the sixth band group by mixing the second frequency signal of 8184 MHz and one of the sixth frequency signal of 528 MHz with (+)sign, the sixth frequency signal of 528 MHz with (−)sign, and the sixth frequency signal of 0 MHz, and the eighth frequency signal corresponding to one of 6864 MHz, 7920 MHz, and 8976 MHz by mixing the second frequency signal of 7920 MHz and one of the sixth frequency signal of 1056 MHz with (−)sign, the sixth frequency signal of 1056 MHz with (+)sign, and the sixth frequency signal of 0 MHz.

The first divider may generate the ninth frequency signal corresponding to the first band group by dividing one of the eighth frequency signals of 6864 MHz, 7920 MHz, and 8976 MHz by two.

The harmonic rejection unit may generate the tenth frequency signal of a sine-wave shape from the fourth frequency signal.

The harmonic rejection unit may include a phase signal selector adapted to select a portion of phase signals of the fourth frequency signal in response to the assistance frequency select signal, a plurality of current sources, a first, a second, and a third of the plurality of current sources having a ratio of $1:\sqrt{2}:1$ relative to each other, and MOS transistors generating the tenth frequency signal by using the selected phase signals as gate inputs, each of the plurality of current sources being respectively coupled to the MOS transistors.

The tenth frequency signal may include a plurality of output signals corresponding to a combination of phase signals corresponding to current values of the first, second, and third current sources.

The phase signals may be signals having a predetermined phase difference.

The frequency signal generation unit may be adapted for use in a multi-band orthogonal frequency division multiplexing (MB-OFDM) system.

The selector may include a single switch.

The selector may include a plurality of switches.

At least one of the above and other features and advantages may be realized by providing a transmitter, including a base band unit adapted to generate a digital signal of a base band, a digital analog converter adapted to convert the digital signal of the base band into an analog signal, a first mixer, a radio frequency filter adapted to filter a specific frequency band of a transmitting signal output from the mixer, a power amplifier adapted to amplify and transmit a signal output from the radio frequency filter, a radio frequency unit adapted to transmit an output signal from the power amplifier through an antenna, and a frequency signal generation unit, the frequency signal generation unit, including a control circuit adapted to generate a frequency generation signal, an assistance frequency select signal, a sign select signal, and a dividing select signal, a reference frequency signal generator adapted to generate a first frequency signal and generate a second frequency signal by dividing the generated first frequency signal, an assistance frequency signal generator adapted to generate a third frequency signal, generate fourth and fifth frequency signals by dividing the third frequency signal by a different division ratio, and generate a sixth frequency signal from the fourth and fifth frequency signals in response to the assistance frequency select signal, a mixer adapted to select a sign of the sixth frequency signal in response to the sign select signal and generate a seventh frequency signal and a eighth frequency signal by mixing the sixth frequency signal of the selected sign and the first frequency signal, a switch adapted to output the seventh frequency signal or the eight frequency signal in response to the dividing select signal, and a first divider adapted to output a ninth frequency signal by dividing the eighth frequency signal received from the switch, the first divider being coupled to the switch, wherein the first mixer is adapted to mix a transmitting signal output from the digital analog converter and at least one of the frequency signals output by the frequency signal generation unit.

The radio frequency filter may be a low pass filter.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
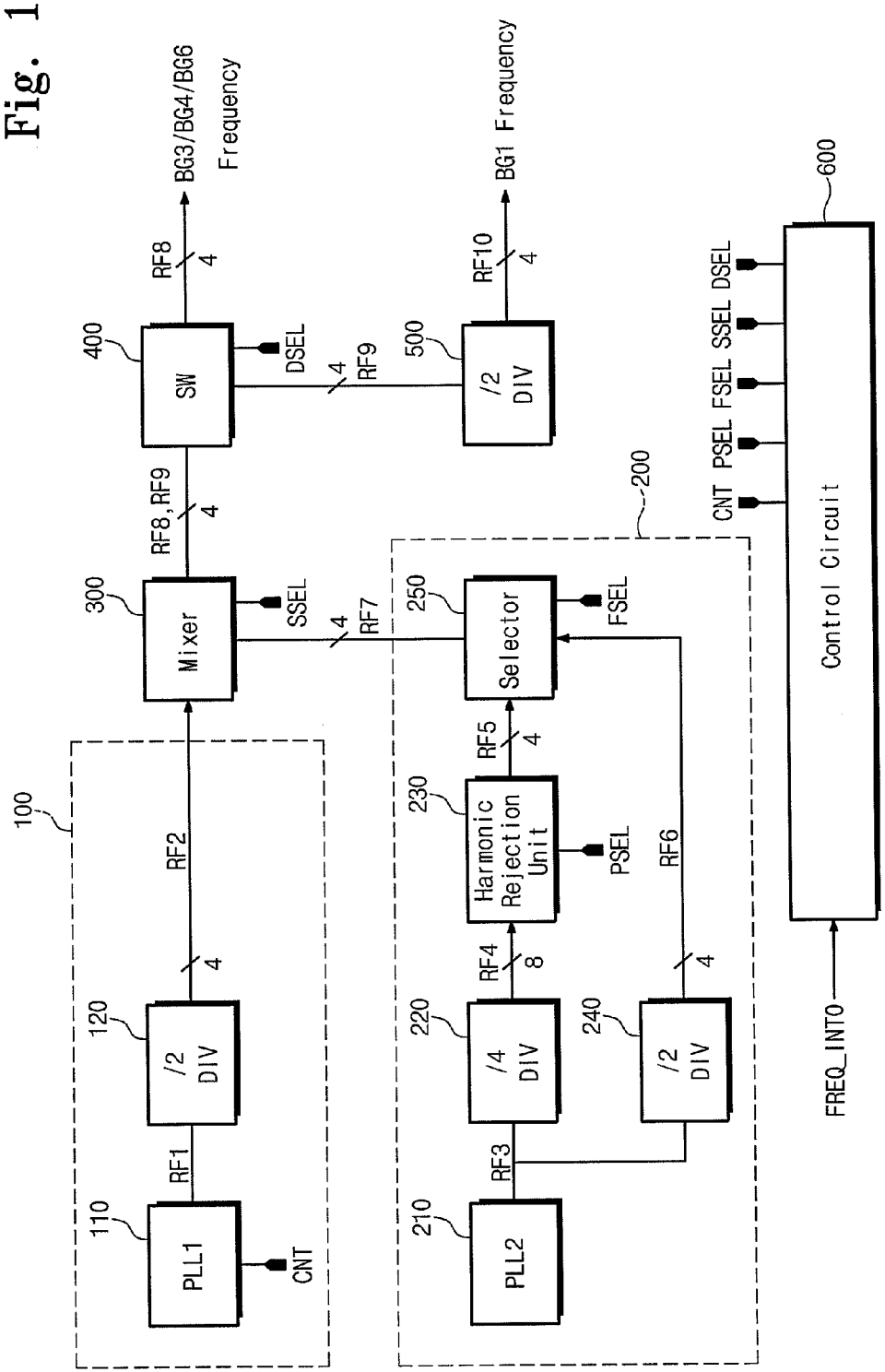
FIG. 1 illustrates a block diagram of an exemplary embodiment of a frequency signal generation unit.

Korean Patent Application No. 10-2010-0010066, filed on Feb. 3, 2010, in the Korean Intellectual Property Office, and entitled: "Apparatus for Generating Frequency Signal," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "between" two elements, it can be the only element between the two elements, or one or more intervening elements may also be present. It will be also be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. Like reference numerals refer to like elements throughout the specification.

The inventive concept relates to a wideband communication system, and more particularly, to a frequency signal generating apparatus generating frequency signals of various band groups.

Multi-Band Orthogonal Frequency Division Multiplexing (hereinafter it is referred to as 'MB-OFDM') is one method for embodying wideband communication systems. In the MB-OFDM method, a whole spectrum of frequencies in a 3.1 GHz~10.6 GHz frequency band are divided into a plurality of groups, e.g., fourteen 528 MHz bandwith groups, as set forth in Table 1 below. Each of the band groups may include one or more bands. It may be mandatory for a first band group (BG1), e.g., a lowest frequency band, to include three (3) channels, while channels of the other band groups may be optional. More particularly, referring to Table 1 below, e.g., six band groups may be identified. A frequency signal generating apparatus in a wideband communication system may generate only frequency signals of each band group. Embodiments may provide a wireless service that supports multi-band multi-mode communication by providing an apparatus adapted to generate frequency signals of a plurality of different bands.

An exemplary band grouping of an MB-OFDM method is represented in a Table 1 below.

TABLE 1

| Band group (BG) | Band group identifier (BID) | Center frequency, MHz |
|---|---|---|
| 1 | 1 | 3432 |
|   | 2 | 3960 |
|   | 3 | 4488 |
| 2 | 1 | 5016 |
|   | 2 | 5544 |
|   | 3 | 6072 |
| 3 | 1 | 6600 |
|   | 2 | 7128 |
| 6 | 3 | 7656 |
| 4 | 1 | 8184 |
|   | 2 | 8712 |
|   | 3 | 9240 |
| 5 | 1 | 9768 |
|   | 2 | 10296 |

Embodiments may provide a frequency signal generation unit adapted to generate frequency signals of, e.g., band groups 1, 3, 4, and 6.

FIG. 1 illustrates a block diagram of an exemplary embodiment of a frequency signal generation unit. Referring to FIG. 1, the frequency signal generation unit may include a reference frequency signal generation unit 100, an assistance frequency signal generation unit 200, a mixer 300, a switch 400, a first divider 500, and a control circuit 600.

The reference frequency signal generation unit 100 may include a first phase locked loop (PLL) 110, and a second divider 120. The reference frequency signal generation unit 100 may generate a reference frequency signal, e.g., a second frequency signal RF2, for generation of a frequency signal corresponding to a plurality of the band groups, e.g., for band groups 1, 3, 5, and 6 (BG1, BG3, BG5, and BG6).

The first phase locked loop 110 may generate a first frequency signal RF1 in response to a frequency generation signal CNT. For example, the first frequency signal RF1 may include frequency signals of a 15312 MHz band, a 15840 MHz band, and a 16368 MHz band. The first phase locked loop 110 may generate a first frequency corresponding to the frequency generation signal CNT among frequency signals of a 15312 MHz band, a 15840 MHz band, and a 16368 MHz band. A frequency tuning range of the first phase locked loop 110 may be equal to and/or about (+/−)7%.

The second divider 120 may divide the first frequency signal RF1 by two (2), and may generate the second frequency signal RF2. For example, if the first frequency signal RF1 includes frequency signals of a 15312 MHz band, a 15840 MHz band, and a 16368 MHz band, the second frequency signal RF2 may include frequency signals of a 7656 MHz band, a 7920 MHz band, and a 8184 MHz band.

The assistance frequency signal generation unit 200 may include a second phase locked loop 210, a third divider 220, a harmonic rejection block 230, a fourth divider 240, and a selector 250. The assistance frequency signal generation unit 200 may generate an assistance frequency signal, e.g., a seventh frequency signal RF7, for mixing with the reference frequency signal.

The second phase locked loop 210 may generate a third frequency signal RF3. The third frequency signal RF3 may include, e.g., a frequency signal of a 2112 MHz band.

The third divider 220 may divide the third frequency signal RF3 by four (4) and may generate a fourth frequency signal RF4. The fourth frequency signal RF4 may include, e.g., a frequency signal of a 528 MHz band.

The harmonic rejection unit 230 may reject harmonics of the fourth frequency signal RF4. The harmonic rejection unit 230 may generate a fifth frequency signal RF5 from which harmonics may be rejected in response to a phase select signal PSEL. More particularly, the harmonic rejection unit 230 may generate the fifth frequency signal RF5 having a sine-like-wave shape to reject harmonics. The fifth frequency signal RF5 may correspond to a frequency signal of a 528 MHz band.

The fourth divider 240 may divide the third frequency signal RF3 by two (2) to generate a sixth frequency signal RF6. The sixth frequency signal RF6 may be a frequency signal of a 1056 MHz band.

The selector 250 may select one of the fifth frequency signal RF5, the sixth frequency signal RF6 and a frequency signal of a 0 MHz band in response to an assistance frequency select signal FSEL. The selector 250 may be, e.g., a frequency selector. The selector 250 may select a frequency to output based on the assistance frequency select signal FSEL. The selector 250 may perform an off operation relative to, e.g., the fifth frequency signal RF5 or the sixth frequency signal RF6, i.e., may not switch between the fifth frequency signal RF5 and the sixth frequency signal RF6, or may couple an output line corresponding to the seventh frequency signal RF7 to a ground terminal.

The selector 250 may output the seventh frequency signal RF7 in response to the assistance frequency select signal FSEL. The seventh frequency signal RF7 may be a frequency signal corresponding to one of a 1056 MHz band, a 528 MHz, and a 0 MHz band.

The mixer 300 may be coupled to the reference frequency signal generation unit 100 and the assistance frequency signal generation unit 200. The mixer 300 may mix the reference frequency signal, e.g., the second frequency signal RF2, and the assistance frequency signal, e.g., the seventh frequency signal RF7, to generate an eighth frequency signal RF8 or a ninth frequency signal RF9. The eighth frequency signal RF8 may include frequency signals of 6600 MHz, 7128 MHz, 7656 MHz, 8184 MHz, 8712 MHz, 9240 MHz, 7656 MHz, 8184 MHz, and 8712 MHz corresponding to band groups 3, 4, and 6. The ninth frequency signal RF9 may include frequency signals of 6864 MHz, 7929 MHz, and 8976 MHz for generation of a frequency signal of band group 1 (BG1).

To mix the second frequency signal RF2 and the seventh frequency signal RF7, the mixer 300 may select a sign (+) or (−) of the seventh frequency signal RF7 in response to a sign select signal SSEL. The mixer 300 may be, e.g., a single sideband mixer.

An exemplary operation of the mixer 300 for generating the eighth frequency signal RF8 is described below.

For example, the mixer 300 generating frequency signals of 6600 MHz, 7128 MHz, and 7656 MHz of the third band group BG3 (see Table 1) is described.

The mixer 300 may mix the second frequency signal RF2 of 7656 MHz band and the seventh frequency signal RF7 of 1056 MHz band having a negative (−) sign to output the eighth frequency signal RF8 of 6600 MHz (7656 MHz−1056 MHz) band.

The mixer 300 may mix the second frequency signal RF2 of 7656 MHz band and the seventh frequency signal RF7 of 528 MHz band having a negative (−) sign to output the eighth frequency signal RF8 of 7128 MHz (7656 MHz-528 MHz) band.

The mixer 300 may mix the second frequency signal RF2 of 7656 MHz band and the seventh frequency signal RF7 of 0 MHz band to output the eighth frequency signal RF8 of 7656 MHz (7656 MHz−0 MHz) band.

In embodiments, the mixer 300 may, e.g., generate frequency signals of 8184 MHz, 8172 MHz, and 9240 MHz of the fourth band group BG4 (see Table 1) as described below.

The mixer 300 may mix the second frequency signal RF2 of 8184 MHz band and the seventh frequency signal RF7 of 0 MHz band to output the eighth frequency signal RF8 of 8184 MHz (8184 MHz+0 MHz) band.

The mixer 300 may mix the second frequency signal RF2 of 8184 MHz band and the seventh frequency signal RF7 of 528 MHz band of (+) sign to output the eighth frequency signal RF8 of 8712 MHz (8184 MHz+528 MHz) band.

The mixer 300 may mix the second frequency signal RF2 of 8184 MHz band and the seventh frequency signal RF7 of 1056 MHz band of (+) sign to output the eighth frequency signal RF8 of 9240 MHz (8184 MHz+1056 MHz) band.

In embodiments, the mixer 300 may, e.g., generate frequency signals of 7656 MHz, 8184 MHz, and 8712 MHz of the sixth band group BG6 (see Table 1) as described below.

The mixer 300 may mix the second frequency signal RF2 of 8184 MHz band and the seventh frequency signal RF7 of 528 MHz band of (−) sign to output the eighth frequency signal RF8 of 7656 MHz (8184 MHz−528 MHz) band.

The mixer 300 may mix the second frequency signal RF2 of 8184 MHz band and the seventh frequency signal RF7 of 0 MHz band to output the eighth frequency signal RF8 of 8184 MHz (8184 MHz+0 MHz) band.

The mixer 300 may mix the second frequency signal RF2 of 8184 MHz band and the seventh frequency signal RF7 of 528 MHz band of (+) sign to output the eighth frequency signal RF8 of 8712 MHz (8184 MHz+528 MHz) band.

An exemplary operation of the mixer 300 generating the ninth frequency signal RF9 is described below.

The mixer 300 may mix the second frequency signal RF2 of 7920 MHz band and the seventh frequency signal RF7 of 1056 MHz band of (−) sign to output the ninth frequency signal RF9 of 6864 MHz (7920 MHz−1056 MHz) band.

The mixer 300 may mix the second frequency signal RF2 of 7920 MHz band and the seventh frequency signal RF7 of 0 MHz band to output the ninth frequency signal RF9 of 7920 MHz (7920 MHz+0 MHz) band.

The mixer 300 may mix the second frequency signal RF2 of 7920 MHz band and the seventh frequency signal RF7 of 1056 MHz band of (+) sign to output the ninth frequency signal RF9 of 8976 MHz (7920 MHz+1056 MHz) band.

The switch 400 may switch the ninth frequency signal RF9 to the first divider 500, and may output the eighth frequency signal RF8 in response to a dividing select signal DSEL.

The first divider 500 may divide the ninth frequency signal RF9 by two (2) to generate a tenth frequency signal RF10. The tenth frequency signal RF10 may include frequency signals of 3432 MHz band, 3960 MHz band, and 4488 MHz band.

The tenth frequency signal RF10 may be a frequency signal of the first band group BG1 (see Table 1).

The control circuit 600 may generate the frequency generating signal CNT, the phase select signal PSEL, the assistance frequency select signal FSEL, the sign select signal SSEL, and the dividing select signal DSEL in order to generate a frequency signal corresponding to frequency information. The frequency information may correspond to a frequency to be generated in a frequency signal generation unit and may include at least one of frequencies corresponding to band groups 1, 3, 4, and 6.

Figure 2:
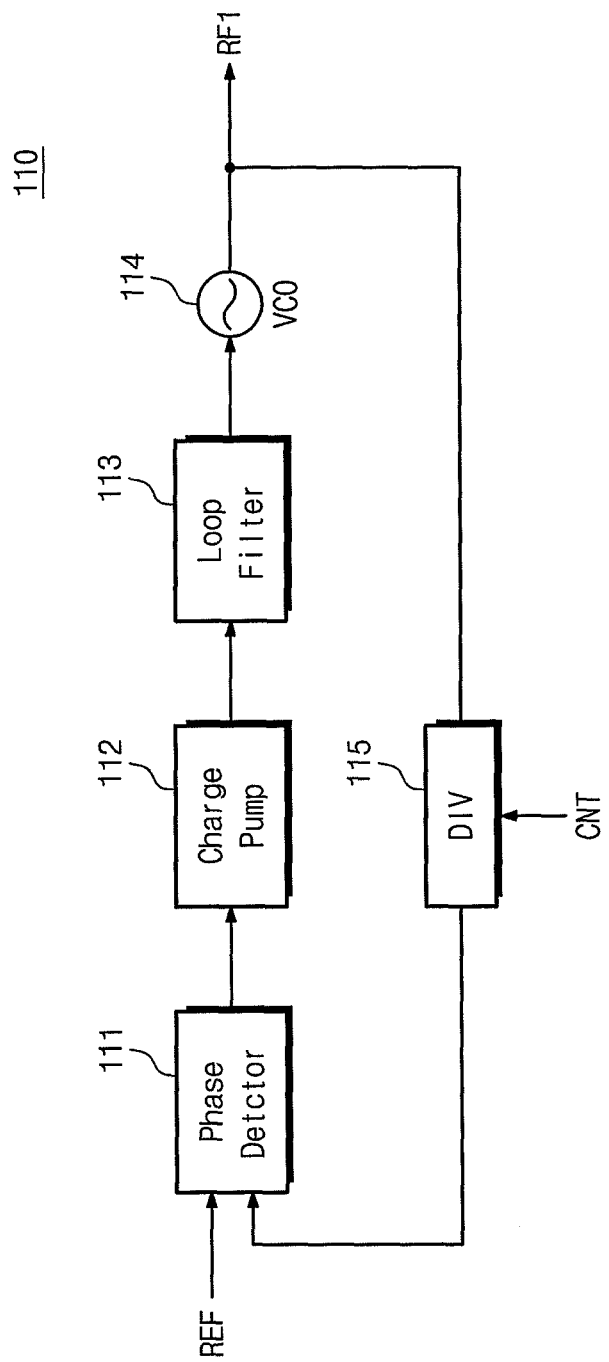
FIG. 2 illustrates a block diagram of an exemplary embodiment of a first phase locked loop employable by the frequency signal generation unit of FIG. 1.

FIG. 2 illustrates a block diagram of an exemplary embodiment of the first phase locked loop 110 employable by the frequency signal generation unit of FIG. 1.

Referring to FIG. 2, the first phase locked loop 110 may include a phase detector 111, a charge pump 112, a loop filter 113, a voltage controlled oscillator (VCO) 114, and a fifth divider 115.

In response to the frequency generating signal CNT, the fifth divider 115 may divide the first frequency signal RF1 by a rate (e.g., 1/N, where N is a real number) corresponding to the frequency generating signal CNT.

The phase detector 111 may compare a frequency difference between a reference frequency signal REF generated within the first phase locked loop 110 and the first frequency signal RF1 divided by the fifth divider 115. The phase detector 111 may output a direct current signal corresponding to a frequency difference between the reference frequency signal REF and the divided first frequency signal RF1.

The charge pump 112 may perform a charge pumping operation in accordance with a pulse width of a direct current signal. The charge pump 112 may output a pumped charge.

The loop filter 113 may accumulate the pumped charges and may filter a noise frequency included in the pumped charges. The loop filter 113 may be, e.g., a low pass filter (LPF).

The voltage controlled oscillator (VCO) 114 may output a specific frequency signal in response to a control voltage output from the loop filter 113. The voltage controlled oscillator (VCO) 114 may output a frequency signal (for example, the first frequency signal RF1) of a specific band.

Figure 3:
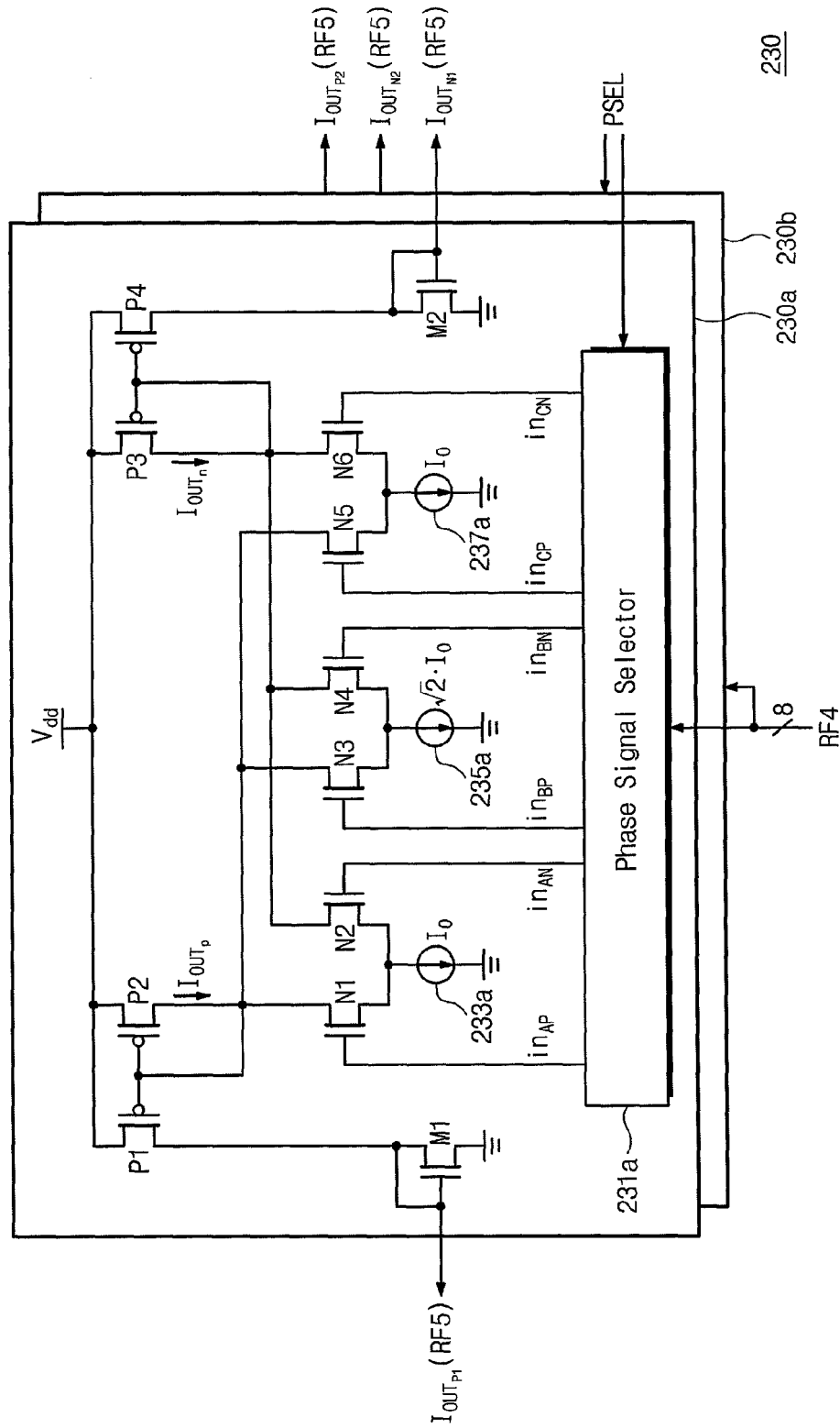
FIG. 3 illustrates a block diagram of an exemplary embodiment of a harmonic rejection unit employable by the frequency signal generation unit of FIG. 1.

FIG. 3 illustrates a block diagram of an exemplary embodiment of a harmonic rejection unit employable by the frequency signal generation unit of FIG. 1.

Referring to FIG. 3, the harmonic rejection unit 230 may include a first harmonic rejection portion 230a and a second harmonic rejection portion 230b. The first harmonic rejection portion 230a and the second harmonic rejection portion 230b may be similar to each other, and thus, only a description of the first harmonic rejection portion 230a will be provided as features described below with regard to the first harmonic rejection portion 230a may also be employed by the second harmonic rejection portions 230b.

The first harmonic rejection portion 230a may include a first phase signal selector 231a, current sources 233a, 235a and 237a, NMOS transistors N1, N2, N3, N4, N5, N6, M1, and M2, and PMOS transistors P1 and P2.

The first phase signal selector 231a may be coupled to the MOS transistors N1, N2, N3, N4, N5, and N6.

The first phase signal selector 231a may select six phase signals, e.g., $in_{AP}$, $in_{AN}$, $in_{BP}$, $in_{BN}$, $in_{CP}$ and $in_{CN}$, from the fourth frequency signal RF4 in response to the phase select signal PSEL. The fourth frequency signal RF4 may include eight phase signals, e.g., $in_{AP}$, $in_{AN}$, $in_{BP}$, $in_{BN}$, $in_{CP}$, $in_{CN}$, $in_{DP}$, and $in_{DN}$.

The first, second, and third current sources 233a, 235a, and 237a may be coupled to a ground. The first current source 233a may be coupled to a node between the first NMOS transistor N1 and the second NMOS transistor N2. The first current source 233a may generate $I_o$. The second current source 235a may be coupled to a node between the third NMOS transistor N3 and the fourth NMOS transistor N4. The second current source 235a may generate $\sqrt{2}I_o$. The third current source 237a may be coupled to a node between the fifth NMOS transistor N5 and the sixth NMOS transistor N6. The third current source 237a may generate $I_o$. Current values of the first through third current sources 233a, 235a, and 237a may correspond to a ratio of 1:$\sqrt{2}$:1.

The first NMOS transistor N1 may be coupled to a node between a gate of the first PMOS transistor P1 and a gate of the second PMOS transistor P2. A gate of the first NMOS transistor N1 may receive the first phase signal $in_{AP}$. The first NMOS transistor N1 may output the first phase signal $in_{AP}$ having a magnitude corresponding to a current value of the first current source 233a.

The second NMOS transistor N2 may be coupled to a node between a gate of the third PMOS transistor P3 and a gate of the fourth PMOS transistor P4. A gate of the second NMOS transistor N2 may receive the second phase signal $in_{AN}$. The second NMOS transistor N2 may output the second phase signal $in_{AN}$ having a magnitude corresponding to a current value of the first current source 233a.

The third NMOS transistor N3 may be coupled to a node between a gate of the first PMOS transistor P1 and a gate of the second PMOS transistor P2. A gate of the third NMOS transistor N3 may receive the third phase signal $in_{BP}$. The third NMOS transistor N3 may output the third phase signal $in_{BP}$, having a magnitude corresponding to a current value of the second current source 235a.

The fourth NMOS transistor N4 may be coupled to a node between a gate of the third PMOS transistor P3 and a gate of the fourth PMOS transistor P4. A gate of the fourth NMOS transistor N4 may receive the fourth phase signal $in_{BN}$. The fourth NMOS transistor N4 may output the fourth phase signal $in_{BN}$ having a magnitude corresponding to a current value of the second current source 235a.

The fifth NMOS transistor N5 may be coupled to a node between a gate of the first PMOS transistor P1 and a gate of the second PMOS transistor P2. A gate of the fifth NMOS transistor N5 may receive the fifth phase signal $in_{CP}$. The fifth NMOS transistor N5 may output the fifth phase signal $in_{CP}$, having a magnitude corresponding to a current value of the third current source 237a.

The sixth NMOS transistor N6 may be coupled to a node between a gate of the third PMOS transistor P3 and a gate of the fourth PMOS transistor P4. A gate of the sixth NMOS transistor N6 may receive the sixth phase signal $in_{CN}$. The sixth NMOS transistor N6 may output the sixth phase signal $in_{CN}$ having a magnitude corresponding to a current value of the third current source 237a.

The first and second PMOS transistors P1 and P2 may be coupled to a power supply voltage Vdd.

The second PMOS transistor P2 may be coupled to the first, third, and fifth NMOS transistors N1, N3, N5, and/or to a node between the first PMOS transistor P1 and the second PMOS transistor P2. More particularly, an electrode of the second PMOS transistor P2 may be coupled to a terminal of each of the first, second, and fifth NMOS transistors N1, N3, N5, and/or to a node between gates of the first PMOS transistor P1 and the second PMOS transistor P2.

The first PMOS transistor P1 may be coupled to the seventh NMOS transistor M1. The first PMOS transistor P1 may output a phase signal including a combination of the phase signals $in_{AP}+in_{BP}+in_{CP}$, of the first, third, and fifth NMOS transistors N1, N3, and N5.

The third PMOS transistor P3 and the fourth transistor P4 may be coupled to the power supply voltage Vdd.

The third PMOS transistor P3 may be coupled to the second, fourth, and sixth NMOS transistors N2, N4, and N6 and/or to a node between the third PMOS transistor P3 and the fourth PMOS transistor P4. More particularly, an electrode of the third PMOS transistor P3 may be coupled to a terminal of each of the second, fourth, and sixth NMOS transistors N2, N4, and N6 NMOS transistors N2, N4, N6, and/or to a node between gates of the third PMOS transistor P3 and the fourth PMOS transistor P4.

The fourth PMOS transistor P4 may be coupled to the eighth NMOS transistor M2. The fourth PMOS transistor P4 may output a phase signal including a combination of the phase signals $in_{AN}+in_{BN}+in_{CN}$ of the second, fourth, and sixth NMOS transistors N2, N4, and N6.

The first harmonic rejection portion 230a may output a first output signal $I_{OUT_{P1}}$ through the seventh NMOS transistor M1 and may output a second output signal $I_{OUT_{N1}}$ through the eighth NMOS transistor M2.

The second harmonic rejection portion 230b may perform a similar operation to the first harmonic rejection portion 230a and may output a third output signal $I_{OUT_{P2}}$ and a fourth output signal $I_{OUT_{N2}}$.

The harmonic rejection unit 230 may generate a fifth frequency signal RF5. The fifth frequency signal RF5 may include the first through fourth output signals $I_{OUT_{P1}}$, $I_{OUT_{N1}}$, $I_{OUT_{P2}}$, and $I_{OUT_{N2}}$.

Figure 4A:
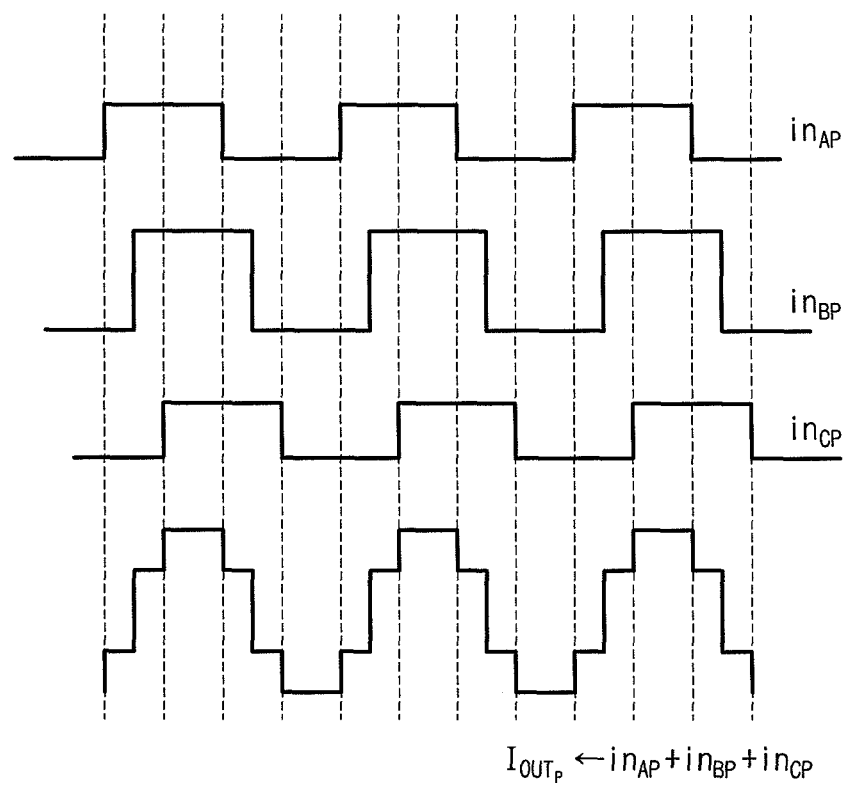
FIG. 4A illustrates a timing diagram of an exemplary output signal of the harmonic rejection unit illustrated in FIG. 3.

FIG. 4A illustrates a timing diagram of an exemplary output signal of the harmonic rejection unit 230 illustrated in FIG. 3.

Referring to FIG. 4A, the harmonic rejection unit 230 may output the fifth frequency signal RF5. The fifth frequency signal RF5 may have a shape similar to a sine-wave. The fifth frequency signal RF5 may include the first through fourth output signals $I_{OUT_{P1}}$, $I_{OUT_{N1}}$, $I_{OUT_{P2}}$, and $I_{OUT_{N2}}$. The first through fourth output signals $I_{OUT_{P1}}$, $I_{OUT_{N1}}$, $I_{OUT_{P2}}$, and $I_{OUT_{N2}}$ may be signals having a sine-like wave shape.

More particularly, FIG. 4A illustrates the first output signal $I_{OUT_{P1}}$ among the fifth frequency signal RF5. The first output signal $I_{OUT_{P1}}$ may be a signal having a similar shape to a sine-like-wave. The first output signal $I_{OUT_{P1}}$ may be a signal output through the seventh NMOS transistor M1, as shown in FIG. 3.

The first output signal $I_{OUT_{P1}}$ may be a combination of phase signals $in_{AP}+in_{BP}+in_{CP}$ corresponding to current values of the first, second, and third current sources 233a, 235a, 237a. The phase signals $in_{AP}+in_{BP}+in_{CP}$ may be signals having a predetermined phase difference, e.g., 45 degrees.

The harmonic rejection unit 230 may reject harmonic components included in the fourth frequency signal RF4 by converting the fourth frequency signal RF4 being input into the fifth frequency signal having a sine-like-wave shape.

Figure 4B:
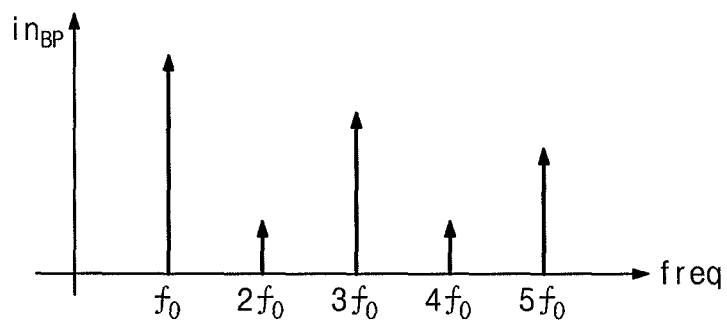
FIG. 4B illustrates a frequency diagram of an exemplary harmonic rejecting operation of the harmonic rejection unit illustrated in FIG. 3.
Figure 4B:
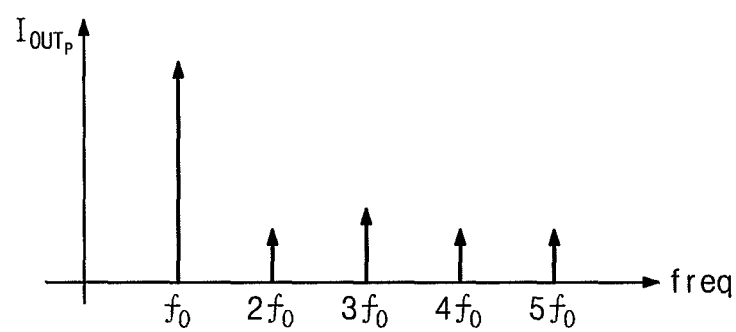

FIG. 4B illustrates a frequency diagram of an exemplary harmonic rejecting operation of the harmonic rejection unit 230 illustrated in FIG. 3.

Referring to FIG. 4B, the third phase signal $in_{BP}$ among the fourth frequency signal RF4 is described as an example. The third phase signal $in_{BP}$ may include a third harmonic signal $f_o$ and a fifth harmonic signal $f_o$ based on a first frequency $f_o$. The harmonic rejection unit 230 may reject harmonic signals of the input fourth frequency signal RF4, e.g., the third phase signal $in_{BP}$, and may output the fifth frequency signal RF5 $I_{OUT_{P1}}$.

Figure 5:
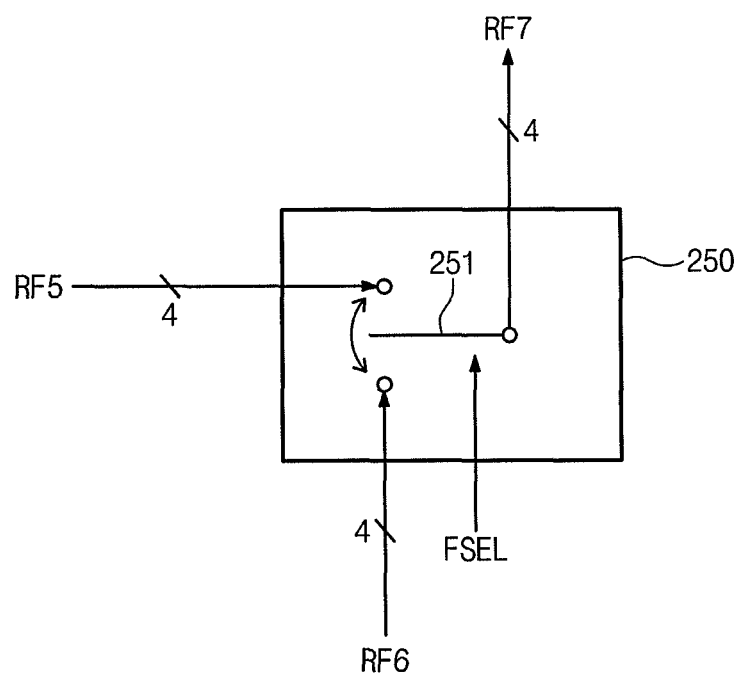
FIG. 5 illustrates a block diagram of an exemplary embodiment of a selector employable by the frequency signal generation unit of FIG. 1.

FIG. 5 illustrates a block diagram of an exemplary embodiment of the selector 250 employable by the frequency signal generation unit of FIG. 1. Referring to FIG. 5, the selector 250 may include a first switch 251 for selecting a frequency of a specific frequency band.

The first switch 251 may switch to one of the sixth frequency signal RF6, the fifth frequency signal RF5, and a frequency signal of 0 MHz in response to the frequency select signal FSEL. To generate a frequency signal of 0 MHz, the first switch 251 may perform an off operation, i.e., not switch to the sixth frequency signal RF6 and the fifth frequency signal RF5, or may switch to a terminal of 0 MHz coupled to a ground. The first switch 251 may output the seventh frequency signal RF7 by a switching control operation.

The first switch 251 may be a single switch or may include a plurality of switches, e.g., four switches. More particularly, e.g., the first switch 251 may include more than one, e.g., four, switches, and may respond to phase signals of frequency signals, e.g., the sixth frequency signal RF4, the fifth frequency signal RF5, a frequency signal of 0 MHz, and the seventh frequency signal RF7.

Figure 6:
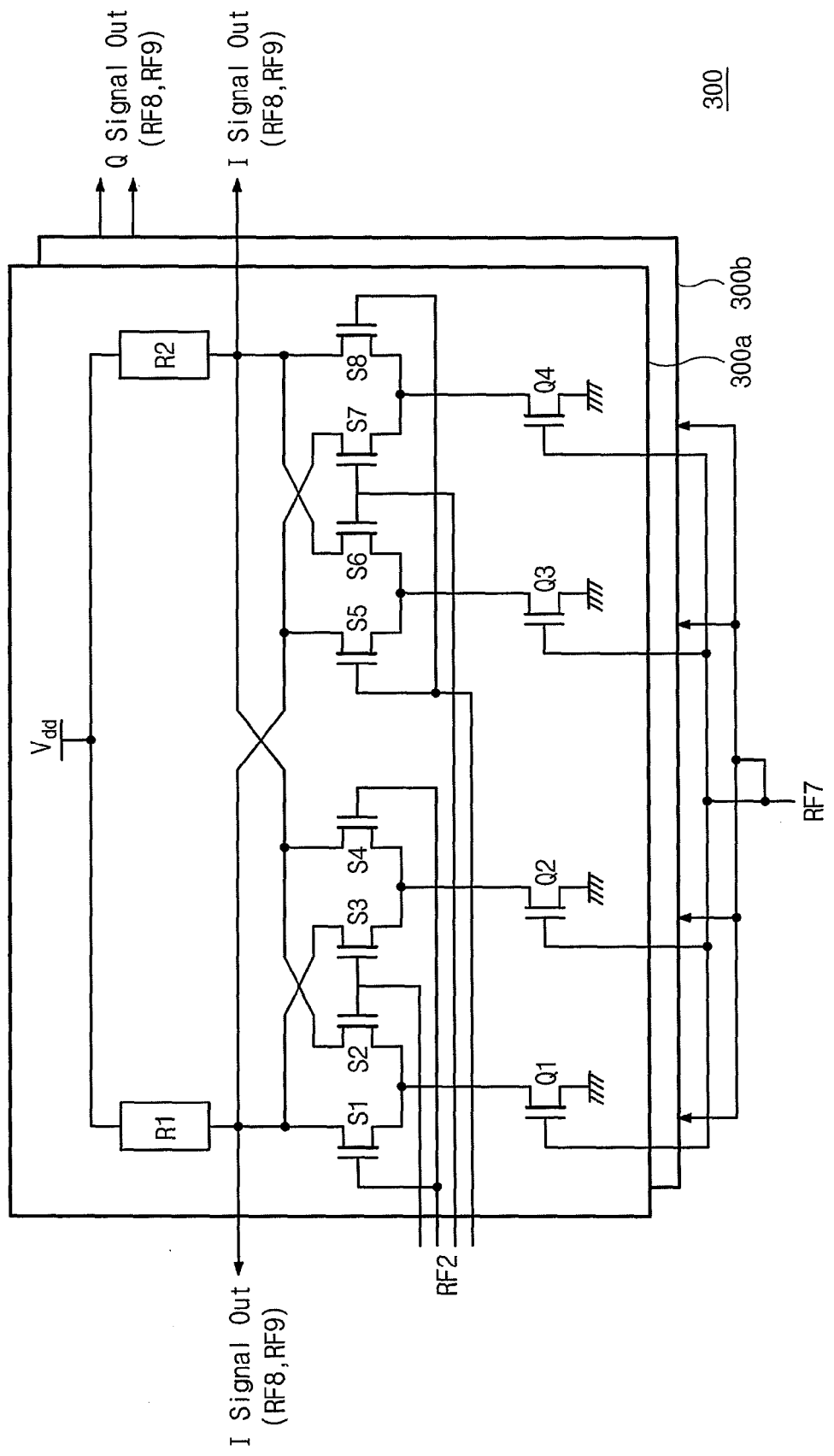
FIG. 6 illustrates a block diagram of an exemplary embodiment of a mixer employable by the frequency signal generation unit of FIG. 1.

FIG. 6 illustrates a block diagram of an exemplary embodiment of the mixer 300 employable by the frequency signal generation unit of FIG. 1.

Referring to FIG. 6, the mixer 300 may include a first mixer 300a and a second mixer 300b. Since the second mixer 300b may be similar in structure to the first mixer 300a, only a description of the first mixer 300a is provided as features described below with regard to the first mixer 300a may also be employed by the second mixer 300b.

The first mixer 300a may include a plurality of NMOS transistors, e.g., ninth through twentieth NMOS transistors Q1, Q2, Q3, Q4, 51, S2, S3, S4, S5, S6, S7, and S8 and a plurality of load resistors R1 and R2.

Referring to FIG. 6, the ninth through twelfth NMOS transistors Q1, Q2, Q3 and Q4 may be coupled to a ground. The ninth through twelfth NMOS transistors Q1, Q2, Q3 and Q4 may receive four phase signals of the seventh frequency signal RF7 through each gate. The ninth through twelfth NMOS transistors Q1, Q2, Q3 and Q4 may form a current mirror with respect to the NMOS transistors, e.g., the seventh NMOS transistor M1 and the eighth NMOS transistor M2, located at an output portion of the harmonic rejection unit 230.

The seventh frequency signal RF7 may have a sine-like-wave shape and may include four phases. Thus, an occurrence of a spur due to harmonic signals having high degree of jitter/noise (e.g., a third harmonic signal, a fifth harmonic signal) may be prevented by using the seventh frequency signal of a sine-like-wave shape. That is, if a current corresponds to a sine-like-wave shape, a voltage change may have a reduced and/or no impact, and thus, an occurrence of a spur may be reduced and/or prevented.

The ninth NMOS transistor Q1 may be coupled to a node between the thirteenth NMOS transistor S1 and the fourteenth NMOS transistor S2. The tenth NMOS transistor Q2 is coupled to a node between the fifteenth NMOS transistor S3 and the sixteenth NMOS transistor S4. The eleventh NMOS transistor Q3 is coupled to a node between the seventeenth NMOS transistor S5 and the eighteenth NMOS transistor S6. The twelfth NMOS transistor Q4 is coupled to a node between the nineteenth NMOS transistor S7 and the twentieth NMOS transistor S8.

The thirteenth NMOS transistor S1, the fifteenth NMOS transistor S3, the seventeenth NMOS transistor S5, and the nineteenth NMOS transistor S7 may be coupled to the power supply voltage Vdd through a first resistor R1.

The fourteenth NMOS transistor S2, the sixteenth NMOS transistor S4, the eighteenth NMOS transistor S6, and the twentieth NMOS transistor S8 may be coupled to the power supply voltage Vdd through a second resistor R2.

The fourteenth NMOS transistor S2 and the fifteenth NMOS transistor S3 may receive a first phase signal of the second frequency signal RF2 through gate electrodes thereof. The thirteenth NMOS transistor S1 and the sixteenth NMOS transistor S4 may receive a second phase signal of the second frequency signal RF2 through gate electrodes thereof. The eighteenth NMOS transistor S6 and the nineteenth NMOS transistor S7 may receive a third phase signal of the second frequency signal RF2 through gate electrodes thereof. The seventeenth NMOS transistor S5 and the twentieth NMOS transistor S8 may receive a fourth phase signal of the second frequency signal RF2 through gate electrodes thereof.

Each of the thirteenth through twentieth NMOS transistors S1, S2, S3, S4, S5, S6, S7, and S8 may output a signal corresponding to a mix of the second frequency signal RF2 and the seventh frequency signal RF7.

The thirteenth, fifteenth, seventeenth, and nineteenth NMOS transistors S1, S3, S5, and S7 may output a phase signal of I component through a node with the first resistor R1. The fourteenth, sixteenth, eighteenth and twentieth NMOS transistors S2, S4, S6 and S8 may output a phase signal of I component through a node with the second resistor R2.

As described above, the first mixer 300a may output a phase signal of I component and the second mixer 300b may output a phase signal of Q component. The phase signal of I component and the phase signal of Q component may together correspond to the eighth frequency signal RF8 or the ninth frequency signal RF9.

Although not illustrated in FIG. 6 in detail, each of the first and second mixers 300a and 300b may be combined with each other by changing a sign (+/−) of the seventh frequency signal RF7 in response to the sign select signal SSEL.

Figure 7:
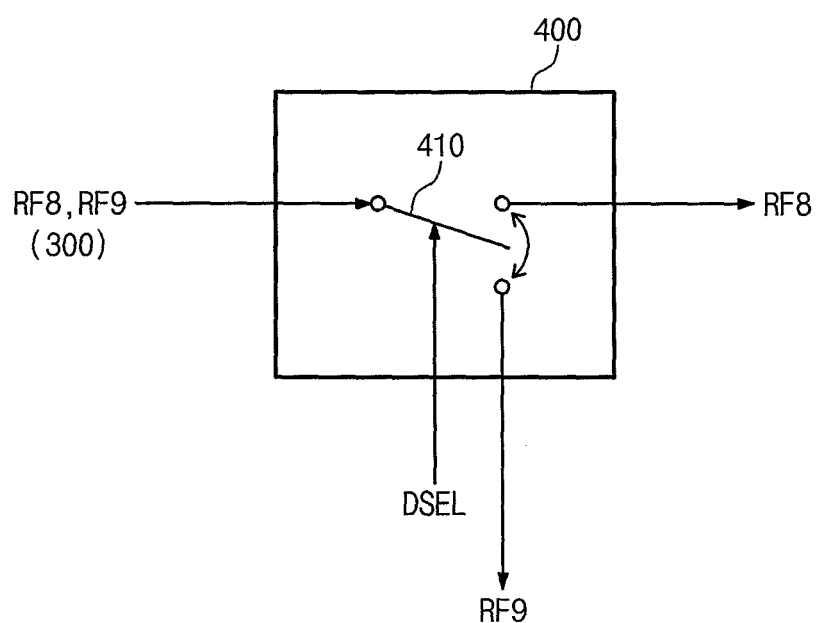
FIG. 7 illustrates a block diagram of an exemplary embodiment of a switch employable by the frequency signal generation unit of FIG. 1.

FIG. 7 illustrates a block diagram of an exemplary embodiment of the switch 400 employable by the frequency signal generation unit of FIG. 1.

Referring to FIG. 7, the switch 400 may include a second switch 410. In response to the dividing select signal DSEL, the second switch 410 may switch so that the eighth frequency signal RF8 may be output and may switch so that the ninth frequency signal RF9 may be output to the first divider 500.

In the exemplary embodiment of FIG. 7, the switch 400 includes one switch for convenience of description, but embodiments are not limited thereto. For example, the switch 400 may include a plurality of switches 410, e.g., four switches corresponding to phase signals of the fourth frequency signal RF4, the fifth frequency signal RF5, the frequency signal of 0 MHz, and the seventh frequency signal RF7, respectively.

Figure 8:
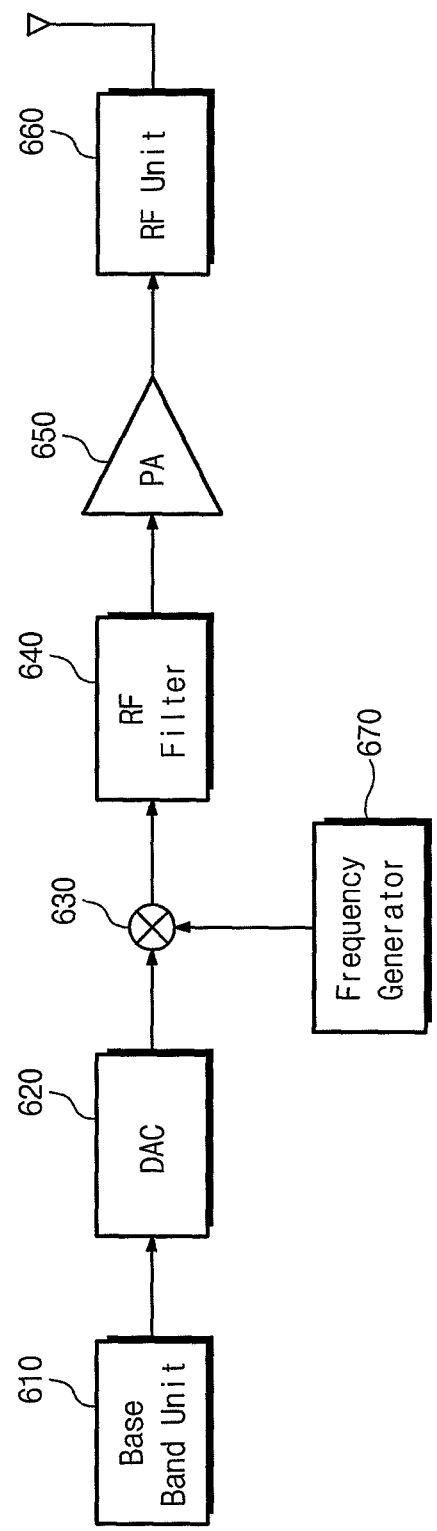
FIG. 8 illustrates a block diagram of an exemplary embodiment of a transmitter employing the frequency signal generation unit of FIG. 1.

FIG. 8 illustrates a block diagram of an exemplary embodiment of a transmitter employing the frequency signal generation unit of FIG. 1.

Referring to FIG. 8, the transmitter may include a base band unit 610, a digital analog converter 620, a mixer 630, a radio frequency (RF) filter 640, a power amplifier 650, a radio frequency (RF) unit 660, and a frequency generator 670.

The base band unit 610 may generate a digital signal of a base band. The digital analog converter 620 may convert a digital signal into an analog signal. The frequency generator 670 may generate a frequency for supporting a frequency band of a signal transmitted from a transmitter. The frequency generator 670 may include one or more features described above with regard to the frequency signal generation unit described above with regard to FIGS. 1-7. The mixer 630 may mix a transmitting signal output from the digital analog converter 620 and a frequency signal output from the frequency generator 670. The radio frequency (RF) filter 640 may filter a specific frequency band of a transmitting signal output from the mixer 630. The radio frequency (RF) filter 640 may be, e.g., a low pass filter. The power amplifier 650 may amplify and transmit a transmitting signal output from the radio frequency (RF) filter 640 to the radio frequency (RF) unit 660. The radio frequency (RF) unit 660 may transmit an output signal of the power amplifier 650 through an antenna.

FIG. 8 illustrates an example of an exemplary application of a frequency signal generation unit employing one or more aspects described herein. Embodiments are not limited to the application and/or structure of the transmitter of FIG. 8.

As described above, in the MB-OFDM method, a whole spectrum of frequencies of 3.1 GHz~10.6 GHz may be divided into a plurality of band groups, e.g., six band groups, and each band group may include a multi-channels having a bandwidth of 528 MHz. Three channels of the first band group, e.g., the lowest frequency band, may be mandatory, while other band groups are optional, e.g., may be selectively set.

Embodiments may provide a frequency signal generating apparatus adapted to generate frequency signals corresponding to channels of multiple ones of the different band groups. For example, a single frequency signal generating apparatus employable in a wideband communication system may be adapted to generate frequency signals for first, third, fifth, and sixth band groups BG1, BG3, BG5, BG6. Embodiments may enable a number of frequency signal generating apparatus to be reduced. For example, assuming six bandgroups as set forth in Table 1 above, embodiments may enable less than six frequency signal generating apparatuses to be employed as one frequency signal generating apparatus may be adapted to generate frequency signals corresponding to more than one, e.g., six, bandgroups. More particularly, each frequency signal generating apparatuses may be adapted to generate frequency signals of a particular one of the bandgroups BG1 to BG6, embodiments may reduce a number of required frequency signal generating apparatuses by providing a frequency signal generating apparatus that may generate frequency signals of, e.g., the first, third, fifth, and sixth bandgroups.

According to the inventive concept, the frequency signal generation unit generates frequency signals of various band groups. Also, the frequency signal generation unit generates all the frequency signals corresponding to 1, 3, 4, and 6 Multi-Band Orthogonal Frequency Division Multiplexing (MB-OFDM) band groups.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A frequency signal generation unit, comprising:
a control circuit adapted to generate a frequency generation signal, an assistance frequency select signal, a sign select signal, and a dividing select signal;
a reference frequency signal generator adapted to generate a first frequency signal and generate a second frequency signal by dividing the generated first frequency signal;
an assistance frequency signal generator adapted to generate a third frequency signal, generate fourth and fifth frequency signals by dividing the third frequency signal by a different division ratio, and generate a sixth frequency signal from the fourth and fifth frequency signals in response to the assistance frequency select signal;
a mixer adapted to select a sign of the sixth frequency signal in response to the sign select signal and generate a seventh frequency signal and a eighth frequency signal by mixing the sixth frequency signal of the selected sign and the first frequency signal;
a switch adapted to output the seventh frequency signal or the eight frequency signal in response to the dividing select signal; and
a first divider adapted to output a ninth frequency signal by dividing the eighth frequency signal received from the switch, the first divider being coupled to the switch.

2. The frequency signal generation unit as claimed in claim 1, wherein the reference frequency signal generator, includes:
a first phase locked loop adapted to generate the first frequency signal in response to the frequency generation signal; and
a second divider adapted to generate a second frequency signal by dividing the first frequency signal by two, the second divider being coupled to the first phase locked loop.

3. The frequency signal generation unit as claimed in claim 2, wherein the assistance frequency signal generator includes:
a second phase locked loop adapted to generate the third frequency signal;
a second divider adapted to generate the fourth frequency signal by dividing the third frequency signal by four;
a harmonic rejection unit adapted to generate a tenth frequency signal by rejecting harmonics of the fourth frequency signal;
a third divider adapted to generate the fifth frequency signal by dividing the third frequency signal by two;
a selector adapted to output the sixth frequency signal by selecting one of the tenth frequency signal and the fifth frequency signal, the selector being coupled to the harmonic rejection unit and the third divider; and
a mixer adapted to output one of the seventh frequency signal and the eighth frequency signals by mixing the second frequency signal and the sixth frequency signal.

4. The frequency signal generation unit as claimed in claim 3, wherein in response to the frequency generation signal, the first phase locked loop is adapted to generate the first frequency signal of 15312 MHz when generating a frequency signal of a third band group, to generate the first frequency signal of 15840 MHz when generating a frequency signal of a first band group, and to generate the first frequency signal of 16368 MHz when generating frequency signals of fourth and sixth band groups, wherein the second divider is adapted to generate a second frequency signal of one of 7656 MHz, 7920 MHz, and 8184 MHz by dividing the respective one of the first frequency signals by two.

5. The frequency signal generation unit as claimed in claim 4, wherein:
the second phase locked loop is adapted to generate the third frequency signal of 2112 MHz,
the third divider is adapted to generate the fourth frequency signal of 528 MHz by dividing the third frequency signal by four,
the fourth divider is adapted to generate the fifth frequency signal of 1056 MHz by dividing the third frequency signal by two, and
the selector is adapted to select the sixth frequency signal of one of 0 MHz, 528 MHz, and 1056 MHz using the fourth frequency signal and the tenth frequency signal.

6. The frequency signal generation unit as claimed in claim 5, wherein the mixer is adapted to generate:
- the seventh frequency signal corresponding to the third band group by mixing the second frequency signal of 7656 MHz and one of the sixth frequency signal of 1056 MHz with (−)sign, the sixth frequency signal of 528 MHz with (−)sign, and the sixth frequency signal of 0 MHz;
- the seventh frequency signal corresponding to the fourth band group by mixing the second frequency signal of 8184 MHz and one of the sixth frequency signal of 1056 MHz with (+)sign, the sixth frequency signal of 528 MHz with (+)sign, and the sixth frequency signal of 0 MHz;
- the seventh frequency signal corresponding to the sixth band group by mixing the second frequency signal of 8184 MHz and one of the sixth frequency signal of 528 MHz with (+)sign, the sixth frequency signal of 528 MHz with (−)sign, and the sixth frequency signal of 0 MHz; and
- the eighth frequency signal corresponding to one of 6864 MHz, 7920 MHz, and 8976 MHz by mixing the second frequency signal of 7920 MHz and one of the sixth frequency signal of 1056 MHz with (−)sign, the sixth frequency signal of 1056 MHz with (+)sign, and the sixth frequency signal of 0 MHz.

7. The frequency signal generation unit as claimed in claim 6, wherein the first divider is adapted to generate the ninth frequency signal corresponding to the first band group by dividing one of the eighth frequency signals of 6864 MHz, 7920 MHz, and 8976 MHz by two.

8. The frequency signal generation unit as claimed in claim 3, wherein the harmonic rejection unit is adapted to generate the tenth frequency signal of a sine-wave shape from the fourth frequency signal.

9. The frequency signal generation unit as claimed in claim 8, wherein the harmonic rejection unit includes:
- a phase signal selector adapted to select a portion of phase signals of the fourth frequency signal in response to the assistance frequency select signal;
- a plurality of current sources, a first, a second, and a third of the plurality of current sources having a ratio of $1:\sqrt{2}:1$ relative to each other; and
- MOS transistors generating the tenth frequency signal by using the selected phase signals as gate inputs, each of the plurality of current sources being respectively coupled to the MOS transistors.

10. The frequency signal generation unit as claimed in claim 9, wherein the tenth frequency signal includes a plurality of output signals corresponding to a combination of phase signals corresponding to current values of the first, second, and third current sources.

11. The frequency signal generation unit as claimed in 10, wherein the phase signals may be signals having a predetermined phase difference.

12. The frequency signal generation unit as claimed in claim 3, wherein the selector includes a single switch.

13. The frequency signal generation unit as claimed in claim 3, wherein the selector includes a plurality of switches.

14. The frequency signal generation unit as claimed in claim 1, wherein the frequency signal generation unit is adapted for use in a multi-band orthogonal frequency division multiplexing (MB-OFDM) system.

15. A transmitter, comprising:
- a base band unit adapted to generate a digital signal of a base band;
- a digital analog converter adapted to convert the digital signal of the base band into an analog signal;
- a first mixer;
- a radio frequency filter adapted to filter a specific frequency band of a transmitting signal output from the mixer;
- a power amplifier adapted to amplify and transmit a signal output from the radio frequency filter;
- a radio frequency unit adapted to transmit an output signal from the power amplifier through an antenna; and
- a frequency signal generation unit, the frequency signal generation unit, including:
  - a control circuit adapted to generate a frequency generation signal, an assistance frequency select signal, a sign select signal, and a dividing select signal;
  - a reference frequency signal generator adapted to generate a first frequency signal and generate a second frequency signal by dividing the generated first frequency signal;
  - an assistance frequency signal generator adapted to generate a third frequency signal, generate fourth and fifth frequency signals by dividing the third frequency signal by a different division ratio, and generate a sixth frequency signal from the fourth and fifth frequency signals in response to the assistance frequency select signal;
  - a mixer adapted to select a sign of the sixth frequency signal in response to the sign select signal and generate a seventh frequency signal and a eighth frequency signal by mixing the sixth frequency signal of the selected sign and the first frequency signal;
  - a switch adapted to output the seventh frequency signal or the eight frequency signal in response to the dividing select signal; and
  - a first divider adapted to output a ninth frequency signal by dividing the eighth frequency signal received from the switch, the first divider being coupled to the switch,
- wherein the first mixer is adapted to mix a transmitting signal output from the digital analog converter and at least one of the frequency signals output by the frequency signal generation unit.

16. The transmitter as claimed in claim 15, wherein the radio frequency filter is a low pass filter.

17. The transmitter as claimed in claim 15, wherein reference frequency signal generator, includes:
- a first phase locked loop adapted to generate the first frequency signal in response to the frequency generation signal; and
- a second divider adapted to generate a second frequency signal by dividing the first frequency signal by two, the second divider being coupled to the first phase locked loop.

18. The transmitter as claimed in claim 17, wherein the assistance frequency signal generator includes:
- a second phase locked loop adapted to generate the third frequency signal;
- a second divider adapted to generate the fourth frequency signal by dividing the third frequency signal by four;
- a harmonic rejection unit adapted to generate a tenth frequency signal by rejecting harmonics of the fourth frequency signal;
- a third divider adapted to generate the fifth frequency signal by dividing the third frequency signal by two;
- a selector adapted to output the sixth frequency signal by selecting one of the tenth frequency signal and the fifth frequency signal, the selector being coupled to the harmonic rejection unit and the third divider; and a mixer adapted to output one of the seventh frequency signal and the eighth frequency signals by mixing the second frequency signal and the sixth frequency signal.

19. The transmitter as claimed in claim 18, wherein in response to the frequency generation signal, the first phase locked loop is adapted to generate the first frequency signal of 15312 MHz when generating a frequency signal of a third band group, to generate the first frequency signal of 15840 MHz when generating a frequency signal of a first band group, and to generate the first frequency signal of 16368 MHz when generating frequency signals of fourth and sixth band groups, wherein the second divider is adapted to generate a second frequency signal of one of 7656 MHz, 7920 MHz, and 8184 MHz by dividing the respective one of the first frequency signals by two.

20. A frequency signal generation unit, comprising:

controlling means for generating a frequency generation signal, an assistance frequency select signal, a sign select signal, and a dividing select signal;

reference frequency signal generating means for generating a first frequency signal and a second frequency signal by dividing the generated first frequency signal;

assistance frequency signal generating means for generating a third frequency signal, fourth and fifth frequency signals by dividing the third frequency signal by a different division ratio, and a sixth frequency signal from the fourth and fifth frequency signals in response to the assistance frequency select signal;

mixing means for selecting a sign of the sixth frequency signal in response to the sign select signal and generate a seventh frequency signal and a eighth frequency signal by mixing the sixth frequency signal of the selected sign and the first frequency signal;

switching means for outputting the seventh frequency signal or the eight frequency signal in response to the dividing select signal; and first dividing means for outputting a ninth frequency signal by dividing the eighth frequency signal received from the switching means.

* * * * *